United States Patent
Hsieh

(10) Patent No.: US 12,278,509 B2
(45) Date of Patent: Apr. 15, 2025

(54) CHARGING METHOD FOR SERIES BATTERY CELLS

(71) Applicant: TAIWAN TRUEWIN TECHNOLOGY CO., LTD., Hsinchu (TW)

(72) Inventor: Fang-Chi Hsieh, Hsinchu (TW)

(73) Assignee: TAIWAN TRUEWIN TECHNOLOGY CO., LTD., Hsinchu (TW)

( * ) Notice: Subject to any disclaimer, the term of this patent is extended or adjusted under 35 U.S.C. 154(b) by 605 days.

(21) Appl. No.: 17/587,119

(22) Filed: Jan. 28, 2022

(65) Prior Publication Data

US 2023/0246460 A1 Aug. 3, 2023

(51) Int. Cl.
*H02J 7/00* (2006.01)
*G01R 31/36* (2020.01)
*G01R 31/3835* (2019.01)

(52) U.S. Cl.
CPC ........ *H02J 7/0024* (2013.01); *G01R 31/3648* (2013.01); *G01R 31/3835* (2019.01); *H02J 7/0014* (2013.01)

(58) Field of Classification Search
CPC ..... H02J 7/0014–0025; G01R 31/3648; G01R 31/3835

USPC .................................................. 320/116–122
See application file for complete search history.

(56) References Cited

U.S. PATENT DOCUMENTS

| | | | |
|---|---|---|---|
| 2012/0032641 A1* | 2/2012 | Yun ........................ | H02J 7/0016 320/118 |
| 2012/0105005 A1* | 5/2012 | Lupienski ............. | H02J 7/0019 320/116 |
| 2013/0049698 A1* | 2/2013 | Jung .................. | H02J 7/007184 320/134 |
| 2016/0218526 A1* | 7/2016 | Drobnik ................ | H02J 7/0018 |
| 2023/0216314 A1* | 7/2023 | McBride ............... | H02J 7/0042 320/118 |

* cited by examiner

*Primary Examiner* — Drew A Dunn
*Assistant Examiner* — Atm M Rahman
(74) *Attorney, Agent, or Firm* — HAUPTMAN HAM, LLP

(57) ABSTRACT

This invention discloses a charging method for series rechargeable battery cells. This invention comprises a Total Voltage Follow-up Procedure (TVFP) in combination with an Artificial Intelligent Equalizing Procedure (AIEP). The TVFP detects deviation of a total voltage and accordingly modifies a trigger voltage for voltage equaling procedure; the AIEP controls the voltage difference of the series battery cells within a predetermined range.

10 Claims, 4 Drawing Sheets

CHARGING METHOD FOR SERIES BATTERY CELLS

BACKGROUND

Technical Field

The present invention discloses a charging method for series battery cells, in particular for charging lithium-ion battery cells connected in series.

Description of Related Art

FIG. 1 shows a prior art.

FIG. 1 disclosed that a charging voltage of 550V with charging current 15A is set to charge one-hundred and sixty (160) pieces of lithium-ion batteries in series. The prior art of FIG. 1 for charging method is as follows:
- Step 1: setting charging voltage/current (550V/15A) to a charger;
- Step 2: charging to 160 pieces of lithium-ion series battery cells;
- Step 3: checking the total voltage and determining whether it is greater than 550V? If no, going back to step 2; and if yes, going to step 4;
- Step 4: Ending the charging process.

After the battery cells are charged according to the prior art, although the total voltage meets the demand, the voltage distribution among individual battery cells is uneven. For example, by calculating with 550V/160=3438 mV, the average voltage for each battery cell is 3438 mV. Among the series battery cells, assuming that one of the battery cells is found to be 3238 mV, there must be another one being with 3638 mV, so that the average voltage will be equal to 3438 mV. The voltage uneven distribution for individual battery cell is because of the intrinsic differences of the structure of each battery cell, comprising material differences, manufacturing process deviation . . . etc., that is why though under the same charging environment, yet series battery cells have uneven voltage distribution.

FIG. 2A shows uneven charged battery cells according to the prior art.

FIG. 2A shows that after the battery cells are charged by the conventional technique of FIG. 1, different battery cell will have different charging states. For example, the voltage of the battery cell 31 is lower than the voltage average line L1, the voltage of the battery cell 32 is higher than the voltage average line L1, and the voltage of the battery cell 33 is approximately equal to the voltage average line L1. The voltage difference among series battery cells causes the power efficiency to deteriorate.

SUMMARY OF THE INVENTION

This invention discloses a charging method for series rechargeable battery cells. This invention comprises a Total Voltage Follow-up Procedure (TVFP) in combination with an Artificial Intelligent Equalizing Procedure (AIEP). The TVFP detects the deviation of the total voltage and accordingly modifies the trigger voltage for battery cells voltage equalization; the AIEP controls the voltage difference of the battery cells being charged within a predetermined range in order that the voltage differences of the battery cells can be kept within a predetermined narrow range.

DETAILED DESCRIPTION OF THE INVENTION

Figure 1:
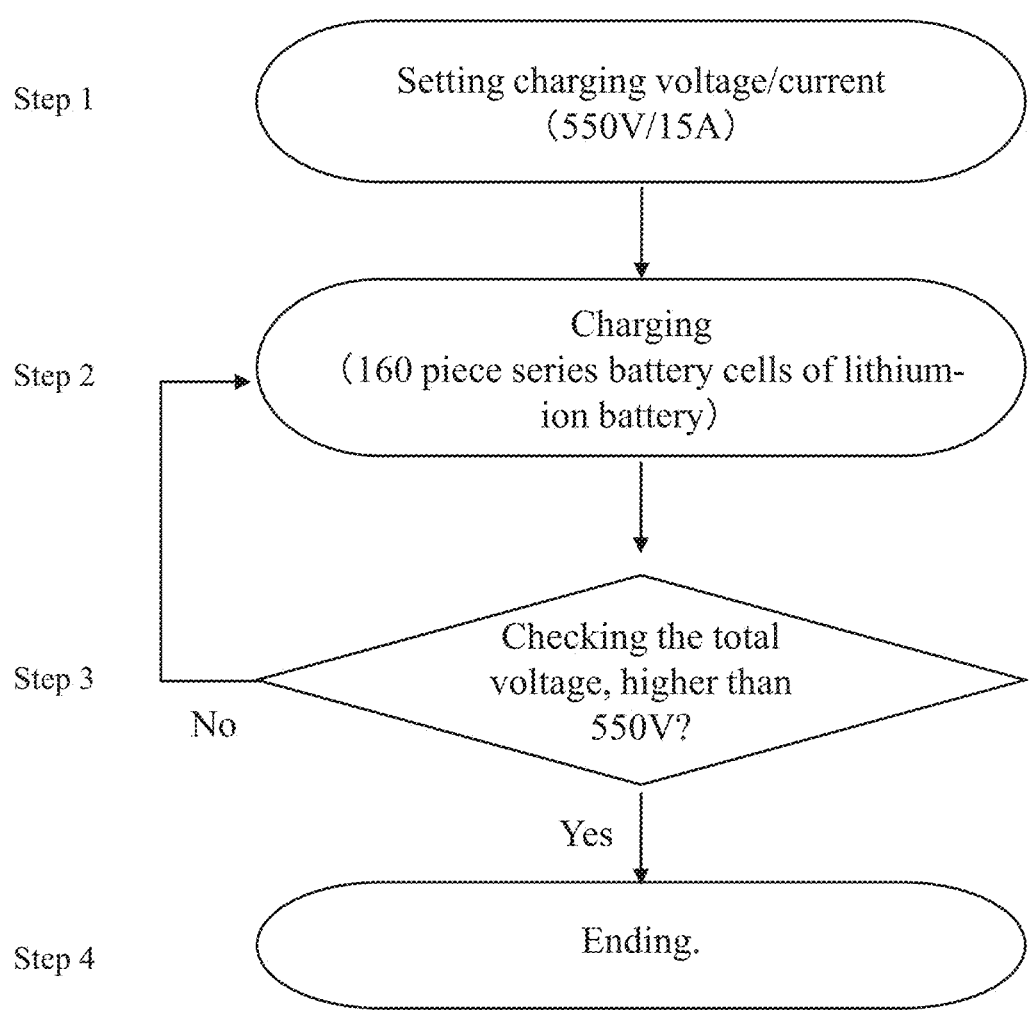
FIG. 1 shows a prior art.
Figure 2A:
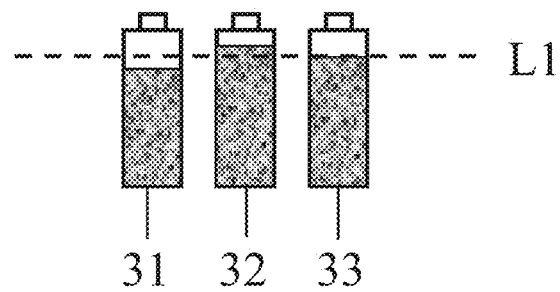
FIG. 2A shows uneven charged battery cells according to the prior art.
Figure 2B:
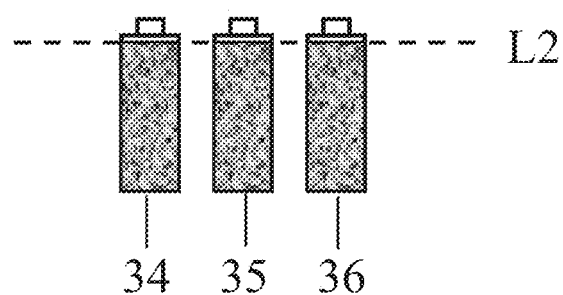
FIG. 2B shows even charged battery cells according to the present invention.

FIG. 2B shows even charged battery cells according to the present invention.

FIG. 2B shows that after charging with the present invention, the charging states among the series battery cells are approximately the same. For example, the voltages of the battery cells 34, 35, and 36 are all approximately equal to the voltage average line L2. Therefore, the voltages among the battery cells being charged are approximately the same, which improves the power efficiency of the series battery cells.

Figure 3:
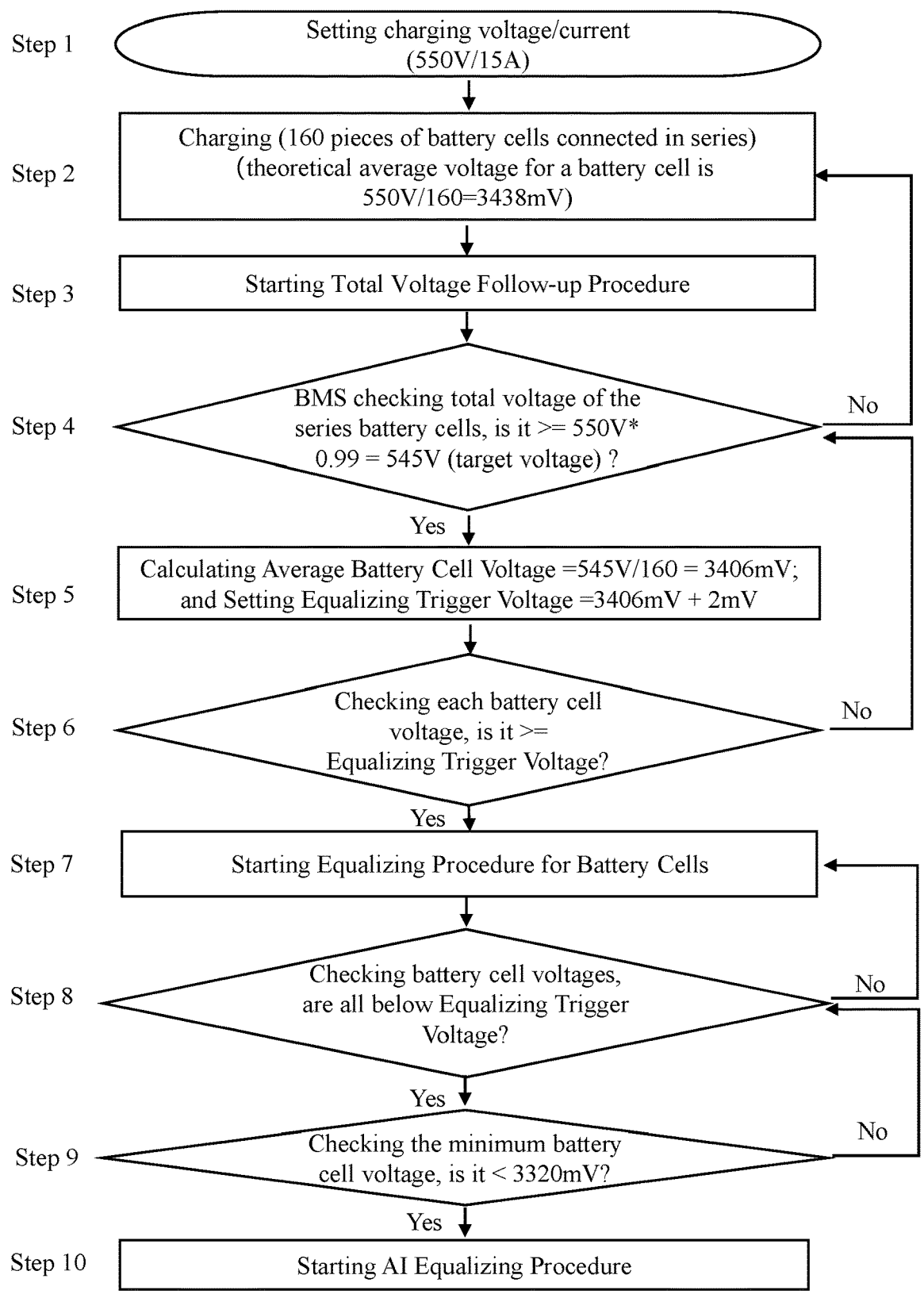
FIGS. 3~4 shows a charging method according to the present invention.
Figure 4:
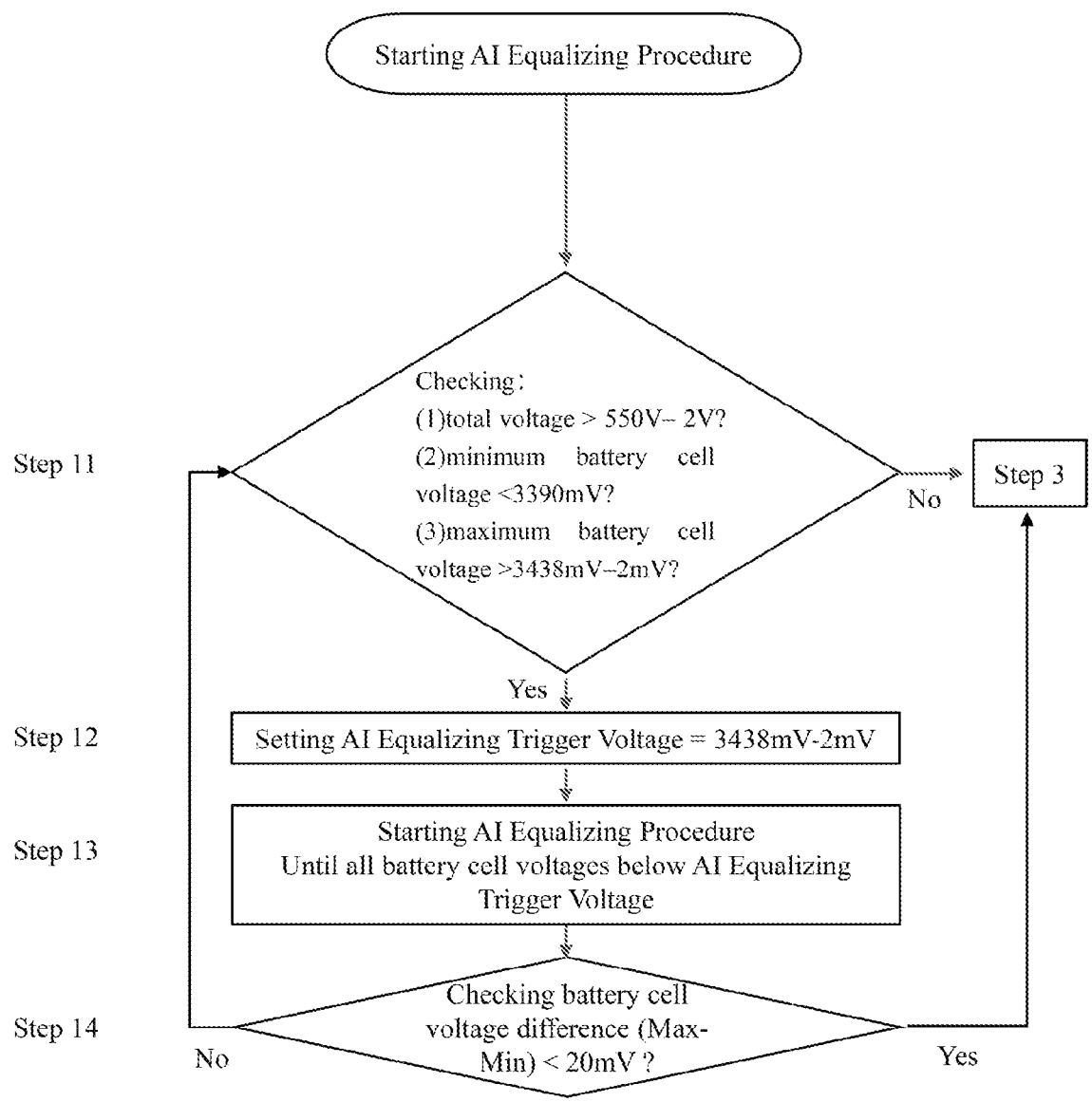

FIGS. 3~4 shows a charging method according to the present invention.

FIGS. 3~4 discloses a charging method for series battery cells according to the present invention which comprises a charger and series battery cells, the charger charging the series battery cells according to the following steps:
- Step 1: setting a charging voltage/current to a charger; for example, in FIG. 3, 550V/15A charging 160 pieces of lithium-ion battery cells connected in series;
- Step 2: charging the series battery cells;
- Step 3: starting a Total Voltage Follow-up Procedure (TVFP);
- Step 4: BMS checking a total voltage of the series battery cells, and determining whether it is greater than or equal to a Target Voltage (TV)? If no, going back to step 2; if yes, going to next step;

for example, in FIG. 3, a target voltage (TV) is set to be 550V*0.99=545V; wherein coefficient 0.99 is changeable according to different requirement;
- Step 5: Calculating an Average Battery Cell Voltage (ABCV) for the series battery cells, ABCV="total voltage of series battery cells" divided by "numbers of series battery cells"; and setting an Equalizing Trigger Voltage (ETV) based on the ABCV;

for example, in FIG. 3, ABCV is calculated to be 545V/160=3406 mV, and the ETV is set to be 3406 mV+2 mV, wherein the 2 mV is changeable according to different requirement;
- Step 6: Checking each battery cell voltage, is it greater than or equal to the Equalizing Trigger Voltage (ETV)? If no, going back to step 4; if yes going to next step;
- Step 7: starting Equalizing Procedure for Battery Cells, discharging specific battery cells;
- Step 8: checking battery cell voltages, are all battery cell voltages below the Equalizing Trigger Voltage (ETV)? if no, going back to step 7; if yes, going to next step;
- Step 9: checking the Minimum Battery Cell Voltage (MBCV), is it smaller than a predetermined Battery Cell Voltage Low Limit (BCVLL)? If no, going back to step 8; if yes going to next step;

for example, in FIG. 3, BCVLL is set to be 3320 mV, wherein the 3320 mV is changeable according to different requirement;

Step 10: Starting AI Equalizing Procedure (AIEP);
Step 11: Checking the following:
(1) is the total voltage greater than a predetermined Total Voltage Low Limit (TVLL)? for example, in FIG. 4, TVLL is set to be 550V-2V, wherein the 2V is changeable according to different requirement;
(2) is the minimum battery cell voltage smaller than a predetermined Battery Cell Voltage Low Limit (BCVLL)? for example, in FIG. 4, BCVLL is set to be 3390 mV, wherein the 3390 mV is changeable according to different requirement;
(3) is the maximum battery cell voltage greater than a predetermined Battery Cell Voltage High Limit (BCVHL)? for example, in FIG. 4, BCVHL is set to be 3438 mV-2 mV, wherein the 2 mV is changeable according to different requirement;
If no, going back to step 3; if yes going to next step;
Step 12: setting AI Equalizing Trigger Voltage (AIETV); for example, in FIG. 4, AIETV is set to be 3438 mV-2 mV which is the same as BCVHL;
  Step 13: starting AI Equalizing Procedure (AIEP), discharging specific battery cells until all battery cell voltages below the AI Equalizing Trigger Voltage (AIETV);
  Step 14: Checking Battery Cell Voltage Difference (BCVD), that is, maximum battery cell voltage minus minimum battery cell voltage, is it smaller than a predetermined Voltage Difference Setting Value (VDSV)? if no, going back to step 11; if yes, going back to step 3;
for example, in FIG. 4 VDSV is set to be 20 mV, wherein the 20 mV is changeable according to different requirement;
The AI Equalizing Procedure (AIEP) in step 10 further comprises an optional step X:
  Step X: turning on the AIEP procedure for a predetermined time period and then closing the procedure. For example, turning on 5 hours and then turning off.
The preferred embodiment uses actual parameters as an example is only for facilitating readers understanding, and which should not be used to limit the right scope of this invention. Except for the actual parameters described in the specification, the following description is also sought to protect:
  wherein, the Target Voltage (TV) in step 4 is lower than the Charging Voltage (CV);
  wherein the Target Voltage (TV) in step 4 equals to the Charging Voltage (CV) multiplied by a coefficient k1:
  $TV=CV*k1$, wherein $k1=98.5\%\sim99.5\%$.
  wherein the Equalizing Trigger Voltage (ETV) in step 5 equals to the Average Battery Cell Voltage (ABCV) multiplied by a coefficient k2:
  $ETV=ABCV*k2$, wherein k2 equals to $1.0005\sim1.0007$.
  wherein the Minimum Battery Cell Voltage (MBCV) in step 9 equals to the Average Battery Cell Voltage (ABCV) multiplied by a coefficient k3:
  $MBCV=ABCV*k3$, wherein $k3=96.5\%\sim98.5\%$.
  wherein the Total Voltage Low Limit (TVLL) in step 11 equals to the charging voltage (CV) multiplied by a coefficient k4:
  $TVLL=CV*k4$, wherein $k4=99.5\%\sim99.7\%$.
  wherein the Battery Cell Voltage Low Limit (BCVLL) in step 11 equals to the Average Battery Cell Voltage (ABCV) multiplied by a coefficient k5:
  $BCVLL=ABCV*k5$, wherein $k5=99.3\%\sim99.7\%$.
  wherein the Battery Cell Voltage High Limit (BCVHL) in step 11 equals to the Average Battery Cell Voltage (ABCV) multiplied by a coefficient k6:
  $BCVHL=ABCV*k6$, wherein $k6=1.007\sim1.010$.
  wherein the Voltage Difference Setting Value (VDSV) in step 14 equals to the Average Battery Cell Voltage (ABCV) multiplied by a coefficient k7:
  $VDSV=ABCV*k7$, wherein, $k7=0.5\%\sim3.5\%$.

While several embodiments have been described by way of example, it will be apparent to those skilled in the art that various modifications may be configured without departs from the spirit of the present invention. Such modifications are all within the scope of the present invention, as defined by the appended claims.

What is claimed is:
1. A charging method for charging a plurality of serially connected battery cells in a charger, the method comprising Step 1 to Step 14, wherein
  Step 1 comprises setting a charging voltage/current to the charger;
  Step 2 comprises charging the serially connected battery cells by the charger;
  Step 3 comprises starting a Total Voltage Follow-up Procedure (TVFP);
  Step 4 comprises:
    BMS checking a total voltage of the serially connected battery cells;
    in response to determining that the total voltage is greater than or equal to a Target Voltage (TV), proceeding to Step 5; and
    otherwise, returning to Step 2;
  Step 5 comprises:
    calculating an Average Battery Cell Voltage (ABCV) for the serially connected battery cells, by dividing the total voltage of the serially connected battery cells by the number of the serially connected battery cells; and
    setting an Equalizing Trigger Voltage (ETV) based on the ABCV;
  Step 6 comprises:
    checking each battery cell voltage;
    in response to determining that the battery cell voltage is greater than or equal to the ETV, proceeding to Step 7; and
    otherwise, returning to Step 4;
  Step 7 comprises starting an Equalizing Procedure for Battery Cells, by discharging specific battery cells having the battery cell voltage greater than or equal to the ETV;
  Step 8 comprises:
    checking all battery cell voltages of the battery cells;
    in response to determining that all battery cell voltages are below the ETV, proceeding to Step 9; and
    otherwise, returning to Step 7;
  Step 9 comprises:
    checking a Minimum Battery Cell Voltage (MBCV);
    in response to determining that the MBCV is smaller than a predetermined Battery Cell Voltage Low Limit (BCVLL), proceeding to Step 10; and
    otherwise, returning to Step 8;
  Step 10 comprises starting an Artificial Intelligent Equalizing Procedure (AIEP);
  Step 11 comprises:
    checking:
      (1) whether the total voltage is greater than a predetermined Total Voltage Low Limit (TVLL),
      (2) whether the MBCV is smaller than a predetermined Battery Cell Voltage Low Limit (BCVLL), and

(3) whether a maximum battery cell voltage is greater than a predetermined Battery Cell Voltage High Limit (BCVHL);
in response to determining that (1), (2) and (3) are satisfied, proceeding to Step 12; and
otherwise, returning to Step 3;

Step 12 comprises setting an AI Equalizing Trigger Voltage (AIETV) based on the BCVHL;

Step 13 comprises discharging specific battery cells having the battery cell voltage greater than or equal to the AIETV, until all battery cell voltages are below the AIETV; and Step 14 comprises:
checking a Battery Cell Voltage Difference (BCVD) being the maximum battery cell voltage minus the MBCV;
in response to determining that the BCVD is smaller than a predetermined Voltage Difference Setting Value (VDSV), returning to Step 3; and
otherwise, returning to Step 11.

2. The charging method according to claim 1, further comprising:
turning on the AIEP for a predetermined time period and then closing the AIEP.

3. The charging method according to claim 1, wherein the Target Voltage (TV) in Step 4 is lower than the charging voltage (CV).

4. The charging method according to claim 3, wherein the Target Voltage (TV) equals to the charging voltage (CV) multiplied by a coefficient k1:
TV=CV*k1, wherein k1=98.5~99.5%.

5. The charging method according to claim 1, wherein the Equalizing Trigger Voltage (ETV) in Step 5 equals to the Average Battery Cell Voltage (ABCV) multiplied by a coefficient k2:
ETV=ABCV*k2, wherein k2=1.0005~1.0007.

6. The charging method according to claim 1, wherein the Minimum Battery Cell Voltage (MBCV) in Step 9 equals to the Average Battery Cell Voltage (ABCV) multiplied by a coefficient k3:
MBCV=ABCV*k3, wherein k3=96.5%~98.5%.

7. The charging method according to claim 1, wherein the Total Voltage Low Limit (TVLL) in Step 11 equals to the charging voltage (CV) multiplied by a coefficient k4:
TVLL=CV*k4, wherein k4=99.5~99.7%.

8. The charging method according to claim 1, wherein the Battery Cell Voltage Low Limit (BCVLL) in Step 11 equals to the Average Battery Cell Voltage (ABCV) multiplied by a coefficient k5:
BCVLL=ABCV*k5, wherein k5=99.3~ 99.7%.

9. The charging method according to claim 1, wherein the Battery Cell Voltage High Limit (BCVHL) in Step 11 equals to the Average Battery Cell Voltage (ABCV) multiplied by a coefficient k6:
BCVHL=ABCV*k6, wherein k6=1.007~1.010.

10. The charging method according to claim 1, wherein the Voltage Difference Setting Value (VDSV) in Step 14 equals to the Average Battery Cell Voltage (ABCV) multiplied by a coefficient k7:
VDSV=ABCV*k7, wherein k7=0.5%~3.5%.

* * * * *